United States Patent

Sato

[11] Patent Number: 5,340,943
[45] Date of Patent: Aug. 23, 1994

[54] METHOD OF USING OXIDE SUPERCONDUCTING CONDUCTOR

[75] Inventor: Kenichi Sato, Osaka, Japan

[73] Assignee: Sumitomo Electric Industries, Ltd., Japan

[21] Appl. No.: 612,023

[22] Filed: Nov. 13, 1990

[30] Foreign Application Priority Data

Nov. 14, 1989 [JP] Japan ................................ 1-296862

[51] Int. Cl.$^5$ ............................................ H01B 12/00
[52] U.S. Cl. .................................. 174/15.4; 335/300; 335/216; 29/599; 505/879; 505/885
[58] Field of Search ................ 335/300, 216, 296; 174/15.4; 29/599; 505/879, 885

[56] References Cited

U.S. PATENT DOCUMENTS

| | | | |
|---|---|---|---|
| 4,021,633 | 5/1977 | Kuwabara et al. | 335/216 |
| 4,895,831 | 1/1990 | Laskaris | 335/300 X |
| 4,924,198 | 5/1990 | Laskaris | 335/216 |
| 4,935,714 | 6/1990 | Vermilyea | 335/216 X |
| 4,965,246 | 10/1990 | Suzawa | 505/885 |
| 5,098,798 | 3/1993 | Smathers | 29/599 X |

FOREIGN PATENT DOCUMENTS 0285028 10/1988 European Pat. Off. .
0292436 11/1988 European Pat. Off. .

OTHER PUBLICATIONS

Jin et al., "High Tc Superconductors-Composite Wire Fabrication", Appl. Phys. Letters, 1987, 51, (3), pp. 203-204.
A. Khurana et al., "High-Temperature Supercurrents May Not Be Forever", Physics Today, Mar., 1980, pp. 17-21.
E. Gregory et al., "Conventional Wire and Cable Technology", 77 Proceedings of the IEEE 8, pp. 1110-1123 (1989).
K. Heine et al., "High-Field Critical Current Densities in $Bi_2Sr_2Ca_2Cu_1O_{8+x}$/Ag Wires", 55 Applied Physics Letters 23, pp. 2441-2443 (1989).

Primary Examiner—Leo P. Picard
Assistant Examiner—L. Thomas
Attorney, Agent, or Firm—Pennie & Edmonds

[57] ABSTRACT

Disclosed herein is a method of using an oxide superconducting conductor in a state including a transition region between a superconducting state and a normal conducting state, i.e., a flux flow state, by supplying the oxide superconducting conductor with a current exceeding its critical current. The oxide superconducting conductor can be used as a current lead for a superconducting magnet or the like, to extremely reduce current loss as compared with a conventional current lead of copper.

9 Claims, 1 Drawing Sheet

METHOD OF USING OXIDE SUPERCONDUCTING CONDUCTOR

BACKGROUND OF THE INVENTION

Field of the Invention

The present invention relates to a method of using an oxide superconducting conductor.

Description of the Background Art

An oxide superconducting conductor has recently been watched as a superconducting material which exhibits a higher critical temperature. As to a method of using such an oxide superconducting conductor, study has been made to cool the conductor to a temperature below its critical temperature similarly to a conventional superconducting conductor of a metal or an intermetallic compound and feed a current for maintaining superconducting state. Namely, an oxide superconducting conductor has been used with supply of a current below its critical current, as a matter of course. Thus, awaited is an oxide superconducting conductor having high critical current density, which can increase the value of an energization current.

SUMMARY OF THE INVENTION

An object of the present invention is to provide a method of using an oxide superconducting conductor, which can further increase the value of an energization current at the same constant critical current density.

The inventive method of using an oxide superconducting conductor is characterized in that the oxide superconducting conductor is used in a state including a transition region between a superconducting state and a normal conducting state.

The inventor have found that a transition region between a superconducting state and a normal conducting state i.e., a flux flow state, of an oxide superconducting conductor, is stable. According to the present invention, an oxide superconducting conductor is used in such a state, so that a large current is supplied in a small resistance state. Such a flux flow state causes resistance, but at an extremely small value. In an oxide superconducting conductor, it is possible to stably obtain such a flux flow state, which cannot be stably obtained in a conventional superconducting conductor of a metal or an intermetallic compound.

The term "superconducting state" indicates a state which causes an electric field of not more than 1 $\mu V/cm$, while the term "normal conducting state" indicates a state which exhibits ordinary resistivity.

According to the present invention, it is preferable to use an oxide superconducting conductor in combination with a stabilizing material. Preferably the stabilizing material at least partially consists of silver or a silver alloy.

According to the present invention, further, it is possible to cool the oxide superconducting conductor with a liquid cooling medium and/or an evaporation gas thereof. The liquid cooling medium may be prepared from helium, for example.

The oxide superconducting conductor used in the present invention, which is not particularly restricted, can be prepared from a yttrium-based, bismuth-based or thallium-based oxide superconducting material, for example.

Yttrium-based, bismuth-based and thallium-based oxide superconducting conductors respectively have superconductivity critical temperatures of 90K, 110K and 120K, which are higher than the liquid nitrogen temperature of 77.3K. The inventor have found that it is possible to stably use such an oxide superconductive conductor in a state including a transition region between a superconducting state and a normal conducting state by cooling the conductor at a temperature considerably lower than its superconductivity critical temperature and supplying the same with a current exceeding its critical current. The cooling temperature for using such an oxide superconducting conductor is preferably not more than about 50% of the superconductivity critical temperature, for example. But, the cooling temperature may be chosen for any temperature if such an oxide superconducting conductor shows permitted resistance.

When a superconducting conductor of 50 cm in length is vertically arranged and its lower end is dipped in liquid helium, for example, the temperature at the lower end is 4.2K and that at the upper end is about 16 to 50K. If an oxide superconducting conductor is used in such a state, for example, it is possible to stably feed a large energization current in a state including a transition region between a superconducting state and a normal conducting state. Resistance caused in this case is at an extremely small value.

According to the present invention, it is possible to increase an energization current value as compared with the prior art by using an oxide superconducting conductor in a state including a transition region between a superconducting state and a normal conducting state. Since resistance caused in such a flux flow state is extremely small, it is possible to greatly reduce Joule loss which is caused by energization, thereby suppressing the amount of evaporation of a cooling medium.

These and other objects, features, aspects and advantages of the present invention will become more apparent from the following detailed description of the present invention when taken in conjunction with the accompanying drawings.

DESCRIPTION OF THE PREFERRED EMBODIMENTS

Example 1

Figure 1:
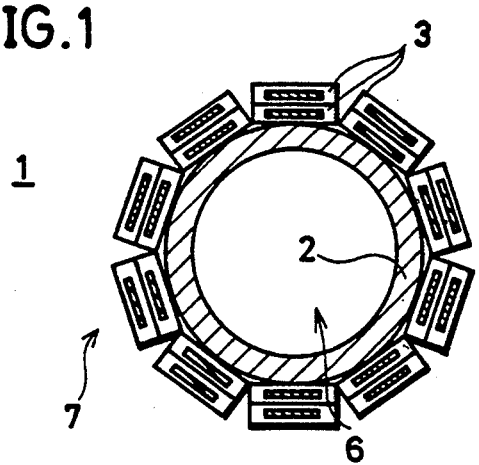
FIG. 1 is a sectional view showing a superconducting conductor 1, for illustrating Example 1 of the present invention.

FIG. 1 is a sectional view showing a superconducting conductor 1, for illustrating Example 1 of the present invention.

Figure 2:
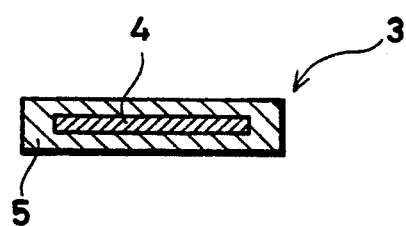
FIG. 2 is an enlarged sectional view of a superconducting wire 3 provided in the superconducting conductor 1 shown in FIG. 1.

The superconducting conductor 1 comprises a silver pipe 2 which has a circular sectional configuration, and ten pairs of double-layer tape-type superconducting wires 3 are arranged on the outer periphery of the silver pipe 2 in a point-symmetrical manner in section. Each superconducting wire 3 is 0.5 mm thick and 3.8 mm wide. As understood from an enlarged sectional view shown in FIG. 2, each superconducting wire 3 comprises a BiPbSrCaCuO-type oxide superconductor 4 enclosed by a silver sheath 5, which serves as a stabilizing material.

The superconductive conductor 1 has a cooling space 6 in the silver pipe 2, and defines another cooling space 7, which is enclosed by an insulator (not shown), along its outer periphery.

In order to obtain such a Superconducting conductor 1, superconducting wires 3 were so prepared as to attain a critical temperature of 106K, critical current density of 1000 A/cm$^2$ at 77.3K and a critical current of 10.5 Å. These superconducting wires 3 were arranged on a silver pipe 2 to linearly extend along the longitudinal directions thereof. Then, heat treatment was performed in the atmosphere at 845° C. for 50 hours, to sinter the oxide superconductors 4 provided in the superconducting wires 3 and to integrated the silver pipe 2 with the silver sheaths 5 of the superconducting wires 3 while simultaneously integrating the silver sheathes 5 themselves with each other by diffusion bonding. After the heat treatment, the superconductive conductor 1, which was 50 cm in length, exhibited a critical current of 150 A (as defined generating 1 $\mu$V for 40 cm length) in liquid nitrogen. In liquid helium, on the other hand, the superconducting conductor 1 exhibited a critical current of 950 A (as defined generating 1 $\mu$V for 40 cm length). This conductor was vertically arranged so that its lower end was dipped in liquid helium and its upper part was cooled with an evaporation gas of helium. Upon energization with a current of 1500 A, a voltage of 70 $\mu$V was generated for 40 cm length and the temperature at the upper end of the conductor was 30K.

Example 2

Figure 3:
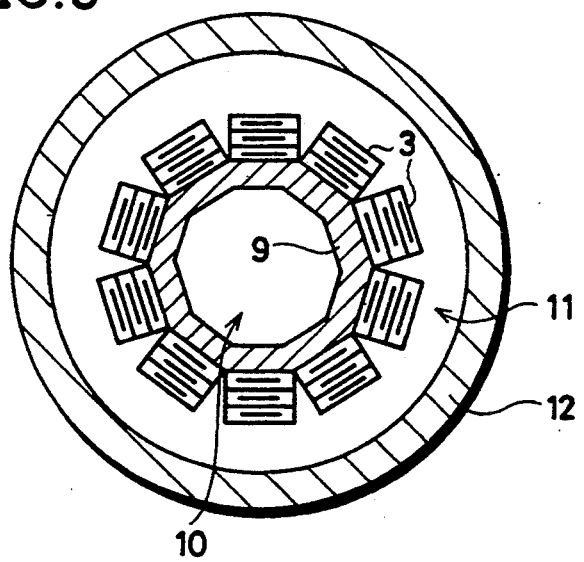
FIG. 3 is a sectional view showing a superconducting conductor 8, for illustrating Example 2 of the present invention.

FIG. 3 is a sectional view showing a superconducting conductor 8, for illustrating Example 2 of the present invention.

In order to obtain such a superconducting conductor 8, triple-layer superconducting wires of 0.37 mm thick, 3.7 mm wide and 50 cm long each were independently heat treated. These superconducting wires were fixed onto a decagonally formed outer peripheral surface of an FRP pipe 9 with an adhesive for low temperature service. A cooling space 10 was defined inside the FRP pipe 9. In order to improve cooling efficiency of the cooling space 10, the FRP pipe 9 was provided with holes (not shown) of 2 mm in diameter at intervals of 10 mm. The superconducting wires 3 were enclosed by another FRP pipe 12, to define another cooling space 11 in the exterior of the superconducting wires 3 which were arranged in the aforementioned manner. The FRP pipe 12 was fixed by FRP spacers (not shown) at several portions, in order to maintain the cooling space 11 constant.

Liquid nitrogen was introduced into the cooling spaces 10 and 11 of the superconducting conductor 8 which was obtained in the aforementioned manner, to energize the same. At this time, the superconductive conductor 8 exhibited a critical current of 170 A (as defined generating 1 $\mu$V for 40 cm length).

On the other hand, this superconducting conductor exhibited a critical current of 1000 A (as defined generating 1 $\mu$V for 40 cm length) in liquid helium. Similarly to Example 1, this conductor was vertically arranged and the lower and upper ends thereof were cooled with liquid helium and an evaporation gas of helium respectively. When the conductor was energized with a current of 2000 A in this state, a voltage of 320 $\mu$V was generated for 40 cm length and the temperature at the upper end was 35K. In this case, the sectional area was compactly reduced to 30% of that of a conventional current lead made of copper for energization with a current of 1800 A. Further, it was confirmed possible to reduce the amount of evaporation of helium by at least 20%. Thus, it has been clarified that the present invention is effective as a method of using a power lead for a superconducting magnet which is employed at 4.2K, a superconducting cable used at 77.3K or the like, for example, since it is possible to stably maintain an extremely small loss state according to the present invention, although small resistance is caused.

Example 3

A silver pipe with a external diameter of 12 mm and an internal diameter of 8 mm was filled with the powder having average particle diameter of 0.9 $\mu$m and $Bi_{1.8}Pb_{0.4}Sr_2Ca_2Cu_3O_y$ composition consisting of superconductive phaze mainly composed of 2212 phaze and non-superconductive phaze, similarly to example 1. This composite material was drawn to be 1 mm in diameter and rolled to be 0.18 mm in thickness through a single rolling process, and thereafter sintered for 50 hours at 845° C. Further, it was rolled to be 0.15 mm in thickness. The resultant four tape-type wires of 50 cm long were stacked and sintered for 50 hours at 840° C. to be integrated with each other by diffusion bonding.

The wire which was 50 cm in length exhibited a critical current of 40 A in liquid nitrogen when a specific resistance of $10^{-13}$ $\Omega$m was generated for 40 cm length between voltage terminals. Upon energization with a current of 80 A which was twice the critical current in liquid nitrogen, a voltage of 5 mV was generated, but stable without extraordinary increase in voltage.

MODIFICATIONS

Although the superconducting wires 3 were prepared from BiPbSrCaCuO-type silver-clad wires in the above Examples, such superconducting wires may alternatively be prepared from a material, whose critical temperature exceeds the liquid nitrogen temperature, such as a YBaCuO material, a BiSrCaCuO material, a TlBaCaCuO material, a TlBaSrCaCuO material, TlPbBaSrCaCuO material, a TlPbSrCaCuO material or the like. In place of the silver-clad wires, further, oxide superconductors prepared by a physical film forming method such as sputtering, a chemical film forming method such as CVD, a unidirectional solidifying method, a spinning method or the like, may be combined or covered with a stabilizing material.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of using an oxide superconductor in a stable transition state between a superconducting state and a normal conducting state comprising the steps of;
preparing an oxide superconductor with a critical temperature exceeding the boiling point of liquid nitrogen;
cooling said oxide superconductor to a temperature below that of its superconductivity critical temperature; and energizing said cooled oxide superconductor with a current exceeding the critical current of said oxide superconductor for bringing the same into said stable transition state.

2. A method of using an oxide superconducting conductor in accordance with claim 1, wherein said oxide superconducting conductor is used in combination with a stabilizing material.

3. A method of using an oxide superconducting conductor in accordance with claim 1, wherein said oxide superconducting conductor is cooled with a liquid cooling medium and/or an evaporation gas thereof.

4. A method of using an oxide superconducting conductor in accordance with claim 3, wherein said liquid cooling medium is helium.

5. A method of using an oxide superconducting conductor in accordance with claim 3, wherein said liquid cooling medium is nitrogen.

6. A method of using an oxide superconducting conductor in accordance with claim 1, wherein said oxide superconducting conductor is formed of a yttrium-based, bismuth-based or thallium-based material.

7. A method of using an oxide superconducting conductor in accordance with claim 2, wherein said stabilizing material at least partially consists of silver of a silver alloy.

8. A method of using an oxide superconducting conductor, comprising the steps of:
  preparing an oxide superconducting conductor exhibiting a critical temperature exceeding the boiling point of liquid nitrogen;
  dipping at least one end of said oxide superconducting conductor in liquid helium and cooling the same; and
  supplying said cooled oxide superconducting conductor with a current exceeding said critical current for bringing the same into a flux flow state.

9. A method of using an oxide superconducting conductor in accordance with claim 8, wherein said oxide superconducting conductor is used as a current lead for a superconducting magnet.

* * * * *